(12) United States Patent
Coico et al.

(10) Patent No.: US 7,724,527 B2
(45) Date of Patent: *May 25, 2010

(54) METHOD AND STRUCTURE TO IMPROVE THERMAL DISSIPATION FROM SEMICONDUCTOR DEVICES

(75) Inventors: Patrick A. Coico, Fishkill, NY (US); David L. Edwards, Poughkeepsie, NY (US); Richard F. Indyk, Wappingers Falls, NY (US); David C. Long, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/197,481

(22) Filed: Aug. 25, 2008

(65) Prior Publication Data
US 2008/0310117 A1    Dec. 18, 2008

Related U.S. Application Data

(63) Continuation of application No. 11/681,994, filed on Mar. 5, 2007, now Pat. No. 7,468,886.

(51) Int. Cl.
*H05K 7/20* (2006.01)
*H01L 21/56* (2006.01)
*H01H 23/10* (2006.01)
*H01H 21/48* (2006.01)

(52) U.S. Cl. .............. 361/718; 361/719; 361/702; 361/704; 361/709; 361/710; 361/711; 257/713; 257/721

(58) Field of Classification Search ............ 29/890.035
See application file for complete search history.

(56) References Cited

U.S. PATENT DOCUMENTS

| | | | | |
|---|---|---|---|---|
| 4,978,638 A | * | 12/1990 | Buller et al. | 29/825 |
| 5,083,373 A | * | 1/1992 | Hamburgen | 29/890.03 |
| 5,089,443 A | * | 2/1992 | Kerey et al. | 148/241 |
| 5,108,955 A | * | 4/1992 | Ishida et al. | 29/827 |
| 5,147,821 A | * | 9/1992 | McShane et al. | 264/272.17 |
| 5,158,912 A | * | 10/1992 | Kellerman et al. | 438/126 |

(Continued)

FOREIGN PATENT DOCUMENTS

JP    10070141    3/1998

(Continued)

*Primary Examiner*—Anatoly Vortman
(74) *Attorney, Agent, or Firm*—Cantor Colburn LLP; Joseph Petrokaitis

(57) ABSTRACT

A method and structure of improving thermal dissipation from a module assembly include attaching a first side of at least one chip to a single chip carrier, the at least one chip having a second side opposite of the first side; grinding the second side of the at least one chip to a desired surface profile; applying a heat transfer medium on at least one of a heat sink and the second side of the at least one chip; and disposing the heat sink on the second side of the at least one chip with the heat transfer medium therebetween defining a gap between the heat sink and the second side of the at least one chip. The gap is controlled to improve heat transfer from the second side of the at least one chip to the heat sink.

20 Claims, 3 Drawing Sheets

U.S. PATENT DOCUMENTS

| | | | |
|---|---|---|---|
| 5,169,805 A * | 12/1992 | Mok et al. | 438/117 |
| 5,200,365 A * | 4/1993 | Culver | 156/60 |
| 5,217,922 A * | 6/1993 | Akasaki et al. | 438/125 |
| 5,244,142 A * | 9/1993 | Nishiguchi et al. | 228/180.22 |
| 5,244,838 A * | 9/1993 | Casati et al. | 29/827 |
| 5,254,500 A * | 10/1993 | AuYeung | 29/827 |
| 5,344,795 A * | 9/1994 | Hashemi et al. | 264/272.15 |
| 5,371,404 A | 12/1994 | Juskey et al. | |
| 5,424,251 A * | 6/1995 | Sono et al. | 438/127 |
| 5,471,027 A * | 11/1995 | Call et al. | 219/85.13 |
| 5,517,753 A * | 5/1996 | Messina | 29/841 |
| 5,523,260 A * | 6/1996 | Missele | 156/330 |
| 5,604,978 A | 2/1997 | Sherif et al. | |
| 5,623,394 A | 4/1997 | Sherif et al. | |
| 5,658,831 A * | 8/1997 | Layton et al. | 29/832 |
| 5,706,171 A * | 1/1998 | Edwards et al. | 361/705 |
| 5,724,729 A | 3/1998 | Sherif et al. | |
| 5,757,620 A | 5/1998 | Edwards et al. | |
| 5,770,478 A | 6/1998 | Iruvanti et al. | |
| 5,811,317 A * | 9/1998 | Maheshwari et al. | 29/827 |
| 5,819,402 A | 10/1998 | Edwards et al. | |
| 5,881,944 A | 3/1999 | Edwards et al. | |
| 5,956,576 A | 9/1999 | Toy et al. | |
| 5,981,310 A | 11/1999 | DiGiacomo et al. | |
| 5,990,418 A | 11/1999 | Bivona et al. | |
| 6,025,638 A | 2/2000 | Pogge et al. | |
| 6,035,523 A * | 3/2000 | McNeil et al. | 29/832 |
| 6,091,603 A | 7/2000 | Daves et al. | |
| 6,110,806 A | 8/2000 | Pogge | |
| 6,137,682 A | 10/2000 | Ishimine et al. | |
| 6,255,139 B1 | 7/2001 | Edwards et al. | |
| 6,275,381 B1 | 8/2001 | Edwards et al. | |
| 6,294,408 B1 | 9/2001 | Edwards et al. | |
| 6,368,881 B1 | 4/2002 | Brouillette et al. | |
| 6,451,155 B1 | 9/2002 | Toy et al. | |
| 6,472,762 B1 | 10/2002 | Kutlu | |
| 6,710,443 B1 * | 3/2004 | Rost et al. | 257/712 |
| 6,887,126 B2 | 5/2005 | Brouillette et al. | |
| 2002/0137369 A1 | 9/2002 | Edwards et al. | |
| 2002/0158330 A1 | 10/2002 | Moon et al. | |
| 2003/0067746 A1 | 4/2003 | Ishimine | |
| 2003/0082847 A1 | 5/2003 | Turner et al. | |
| 2004/0014401 A1 | 1/2004 | Tsao et al. | |
| 2005/0127500 A1 | 6/2005 | Colgan et al. | |
| 2005/0139992 A1 | 6/2005 | Holalkere et al. | |
| 2006/0038281 A1 | 2/2006 | Colgan et al. | |
| 2006/0056156 A1 | 3/2006 | Long et al. | |
| 2006/0060952 A1 | 3/2006 | Yuan et al. | |
| 2006/0103011 A1 | 5/2006 | Andry et al. | |
| 2006/0180924 A1 | 8/2006 | Andry et al. | |
| 2006/0202325 A1 | 9/2006 | Coico et al. | |
| 2006/0261467 A1 | 11/2006 | Colgan | |

FOREIGN PATENT DOCUMENTS

| | | |
|---|---|---|
| JP | 2005325348 | 11/2005 |

* cited by examiner

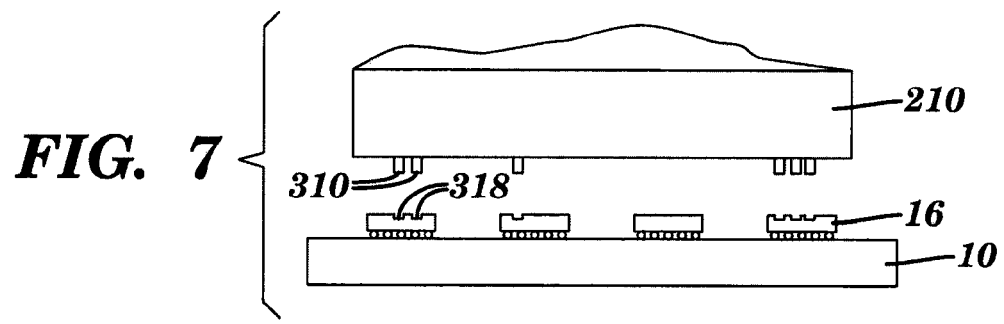
FIG. 7
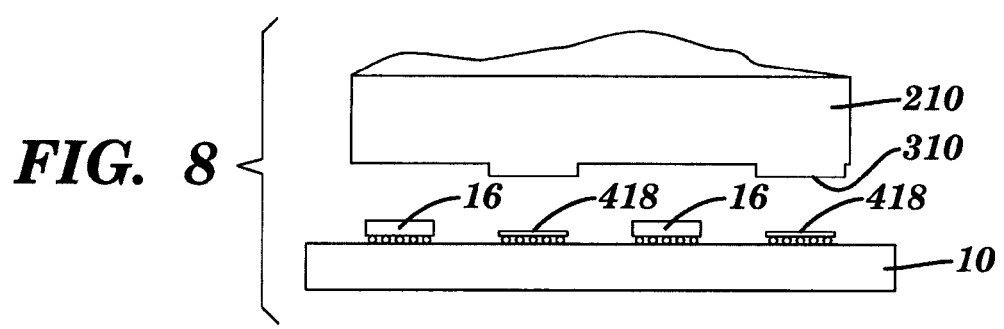
FIG. 8
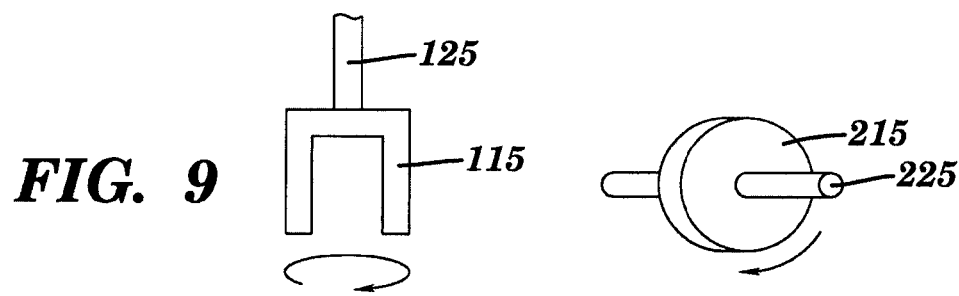
FIG. 9
FIG. 10
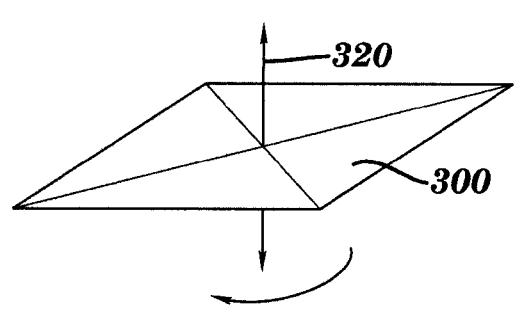
FIG. 11

METHOD AND STRUCTURE TO IMPROVE THERMAL DISSIPATION FROM SEMICONDUCTOR DEVICES

CROSS-REFERENCE TO RELATED APPLICATIONS

This application is a continuation application of U.S. Ser. No. 11/681,994, filed on Mar. 5, 2007, the disclosure of which is incorporated by reference herein in its entirety.

BACKGROUND

The present invention relates generally to semiconductor device processing techniques, and, more particularly, to a method and structure to improve thermal dissipation from semiconductor devices.

In semiconductor manufacturing, a fabricated integrated circuit (IC) device is typically assembled into a package or module to be utilized on a printed circuit board as part of a larger circuit. In order for the leads of the package or module to make electrical contact with the bonding pads of the fabricated IC device, a metal bond is formed to make a connection between the bonding pad of the IC device and a lead extending to the package lead frame. In other configurations, such as a controlled collapse chip connection (C4), a solder ball connection is made between the IC device and the ceramic or polymeric chip carrier.

As heat is generated during the functioning of integrated circuit chips (ICs), the thermal resistance to the heat sink must be small so that the operating temperature of the chip is low enough to assure the continued reliable operation of the device. The problem of heat removal becomes more difficult as chip geometries are scaled down and operating speeds are increased, resulting in increased power density. The ability to adequately cool the chips can therefore be a limiting factor in the further increase of system performance. Integrated circuit chips mounted wiring face down on wiring substrates, and particularly multiple chips on a common substrate such as is found in a multichip module (MCM), present special cooling difficulties. In an MCM, the chips may be mounted very close together and nearly cover an entire top surface of the MCM wiring substrate.

Additionally, the chips may have different cooling requirements. For example, a processor chip may have a higher power density (W/cm$^2$) than a memory chip mounted on the same wiring substrate, or first level package. Further, the maximum allowed device junction temperature may be different for different chips mounted to the same wiring substrate. An additional problem is that processor chips, and other chips, frequently have a "hot spot" which can have a heat flux (W/cm$^2$) significantly greater than the average heat flux across the entire chip, resulting in temperatures approximately 20° C. hotter than the average chip temperature in these localized regions. A thermal solution which may be adequate for the average chip power density may not be adequate to allow reliable operation of the hot spot region of the chip.

Materials are chosen in the module assemblies which maximize the thermal conductivity from the device to an appropriate heat sink. A common technique for reducing the thermal resistance from a high-power IC to a heat sink, or cooling plate, is to add an intermediate layer of a thermally conductive material between the chip and the heat sink, or cooling plate. Due to the difference in thermal expansion between the chip and the material of the cooling plate or heat sink, which is typically copper or aluminum, a compliant thermally conductive material is required. The addition of a heat spreader can be advantageous because the compliant thermally conductive material layer is usually a significant fraction of the total thermal resistance.

Current high end packaging technology utilizes a thermal paste compound to couple a back side of the semiconductor device to the heat sink, which may include a copper hat, for example. Control over the thickness of this thermal paste is critical to the efficiency of the thermal transfer between the semiconductor device and the copper hat.

Typically, an elaborate system of semi-free soldered pistons is employed to register to the exact device height position of each individual device to control the thermal paste gap. The pistons are precisely positioned within the heat sink or hat to precisely match the position of the backsides of each individual device, and then soldered into place. As a result, an appropriate thickness shim can be used to set a controlled thermal paste gap on all devices on the module assembly.

This process, while being inherently expensive due to process step complexity and hat/piston hardware cost, is also prone to chip height registration errors and variations, due to for example, stuck pistons which do not move freely during solder reflow, and thus, is not entirely reliable. Additional variation and non-uniformity of thermal paste gaps can be induced by chip tilt and warpage. While not as much a concern on ceramic packaging, warpage can become significant on organic substrates due to a difference in coefficients of thermal expansion (ΔCTE) between the chip and the chip carrier substrate and especially the more flexible nature of the organic chip carrier substrate. Finally, on low and mid-range multiple chip packages, on which the above described hat/piston technology is cost prohibitive, chip thickness variations directly result in variation in the thermal paste gap.

SUMMARY

The foregoing discussed drawbacks and deficiencies of the prior art and are overcome or alleviated by a method of improving thermal dissipation from a module assembly include attaching a first side of at least one chip to a single chip carrier, the at least one chip having a second side opposite of the first side; grinding the second side of the at least one chip to a desired surface profile; applying a heat transfer medium on at least one of a heat sink and the second side of the at least one chip; and disposing the heat sink on the second side of the at least one chip with the heat transfer medium therebetween defining a gap between the heat sink and the second side of the at least one chip. The gap is controlled to improve heat transfer from the second side of the at least one chip to the heat sink.

In another embodiment, a module assembly includes a chip carrier substrate; a first side of at least one chip permanently mounted to the chip carrier, each chip having a second side opposite of the first side; a heat sink disposed on the second side of each chip having a gap therebetween, the gap being filled with a heat transfer medium. The gap is defined by grinding the second side of each chip to a desired surface profile after permanently mounting the at least one chip to the chip carrier substrate to control heat transfer from the second side of each chip to the heat sink.

In yet another embodiment, a method of manufacturing an electronic packaging structure to enhance heat transfer performance is disclosed. The method includes providing a chip carrier; providing at least one semiconductor device having a first side and a second side; permanently attaching the semiconductor device to the chip carrier with the first side facing the chip carrier; grinding the second side to a desired surface profile; and attaching a heat sink to the chip carrier with a heat transfer paste disposed between the heat sink and the second side. A gap between the second side and the heat sink is controlled via the grinding to improve heat transfer between the semiconductor device and the heat sink.

BRIEF DESCRIPTION OF THE DRAWINGS

Referring to the exemplary drawings wherein like elements are numbered alike in the several Figures:

FIG. 7 is a cross-sectional schematic illustrating an ultrasonic milling head having protrusions extending therefrom, each protrusion corresponding to ground thinner local portions on each backside of individual chips, in accordance with an embodiment of the invention;

FIG. 8 is a cross-sectional schematic illustrating an ultrasonic milling head having protrusions extending therefrom, each protrusion corresponding to globally thinning an entire chip relative to other chips of the module, in accordance with an embodiment of the invention;

FIG. 9 is a schematic drawing illustrating a grinding wheel rotatable via a vertically oriented spindle;

FIG. 10 is a schematic drawing illustrating a grinding wheel rotatable via a horizontally oriented spindle; and FIG. 11 is a schematic drawing illustrating a support surface for a chip module which is rotatable about a vertically oriented spindle for grinding a backside of the chip module.

DETAILED DESCRIPTION

Reference is made below to portions and components that are described as being either horizontal or vertical; these terms are relative. It is not essential that these components actually be oriented in the positions shown in the figures and, in particular, they may be inverted or disposed in directions rotated 90 degrees from that shown or in fact rotated by any amount from that which is shown. In addition, it is also noted that circuit chips have two sides. One is the nominally flat back side of the chip and the other is the face side from which electrical connections are made.

The present invention can be described in relation to several exemplary embodiments. In one exemplary embodiment, a backside of a chip device is ground to be coplanar with other chips mounted on a common wiring substrate or chip carrier (first level package) as an electronic module with a compliant thermal interface using thermal interface material between the chip device and the lid, is provided. In other exemplary embodiments, a backside of a chip device is ground to be in a non-planar configuration.

Figure 1:
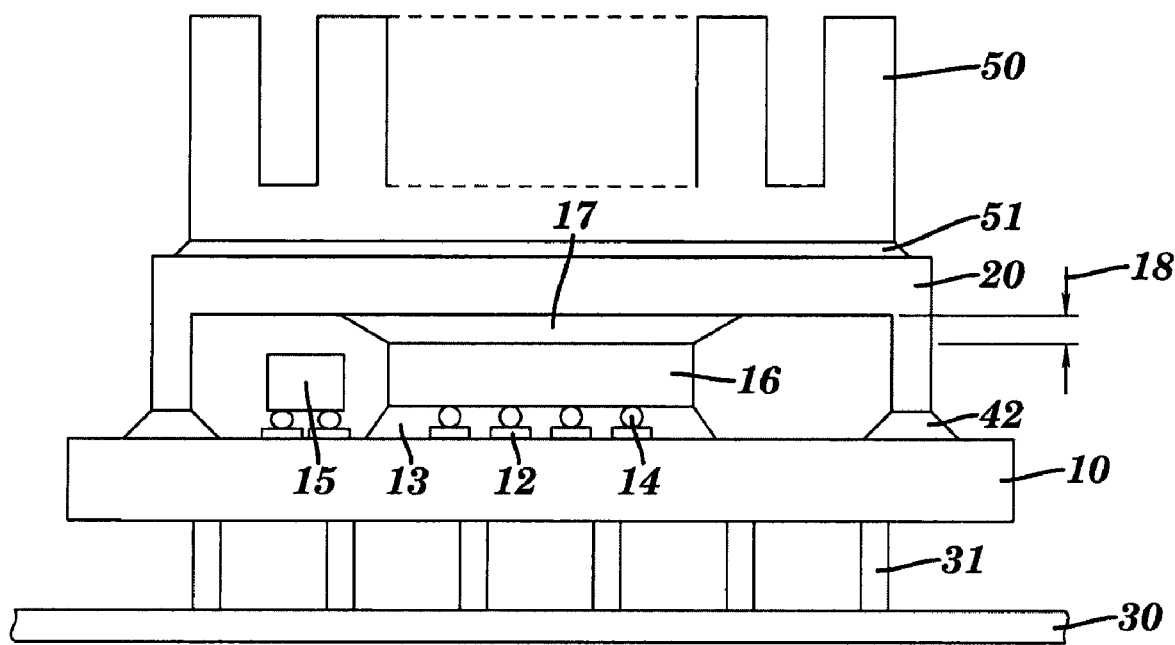
FIG. 1 is a cross-sectional schematic illustrating an exemplary embodiment of the present invention incorporating a single chip module (SCM)

FIG. 1 illustrates an exemplary embodiment of the present invention incorporating a single chip module (SCM). A chip device 16 is connected to a substrate 10. A thermal spreader 20 is joined to substrate 10 through a sealant 42. The thermal spreader 20 may be a "hat" or lid. A thermal interface material 17 provides a cooling path between chip device 16 and lid 20. The embodiment in FIG. 1 in particular illustrates an SCM assembly process with "flip chip" manufacturing. A heat sink 50 is attached to lid 20 with conductive adhesive 51 to further enhance module cooling.

Chip device 16 is secured by solder balls 14, also known in the industry as C4's, and substrate pads 12 to substrate 10. Electrical conductors are disposed within substrate 10 to provide connection to and from chip device 16. Substrate 10 also may include one or more discrete devices 15 such as capacitors, resistors and the like. These discrete devices 15 are secured in the same way as chip device 16 via corresponding solder balls 14 and substrate pads 12. A device underfill material 13 is applied to solder balls 14 or to device interconnects in order to enhance solder joint fatigue life because of coefficient of thermal expansion (CTE) mismatches of the materials during thermal cycling.

After chip device 16 has been joined to substrate 10, the substrate-to-chip device height can be measured mechanically by a height gauge or optically by scanning techniques. The sealing material 42, which has a controlled thickness after lid 20 is attached to substrate 10, is used to attach and seal the lid 20 to the substrate 10.

The substrate is attached directly to a card assembly 30 or to a printed circuit wiring board with substrate interconnect pins 31, interconnect balls or via land grid array (LGA) connectors. For purposes of convenience, simplicity, and ease of understanding the present invention, heat sink 50, card assembly 30, solder balls and LGA connectors are not specifically shown in FIGS. 2-8. It should be understood, however, that these components may additionally be included in the completed module using the embodiments shown in FIGS. 2-8.

The invention shown in FIG. 1 illustrates a completed module using an exemplary method for reducing and controlling the chip-to-lid gap variation or a thermal gap 18 in a sealed module. The thermal gap 18 is preferably controlled by grinding an exposed top surface of device 16 and possibly an exposed top surface of the discrete device 15 before lid 20 or heat sink 50 is attached in order to define the thermal gap 18 later occupied by the thermal interface material 17 on the device 16 after mounting devices 15, 16 on a common wiring substrate or chip carrier (first level package). In exemplary embodiments, the lid 20 may be formed of copper, aluminum, or other suitable materials, to enhance thermal conductivity.

In the above described embodiment, a single chip module (SCM) is used as an example, in which a grinding process is performed on the backside of the Si chip device 16 already mounted on the chip carrier substrate 10. Additional small dummy or discrete devices 15 may be mounted elsewhere on the substrate 10 and could be surface ground to the same plane along with the other functional devices. These dummy devices 15 may act as standoffs for the hat/lid assembly 20 to simultaneously and "perfectly" register all of the devices 15, 16 to the hat/lid surface. Multi-chip modules (MCM) with more than one chip also will benefit from the direct thermal gap control approach of the present invention to improve module thermal performance. In particular, referring to FIG. 2, a plurality of discrete devices 15 are shown disposed in between chip devices 16 which may act as standoffs with respect to a thermal heat spreader (not shown). In particular, FIG. 2 illustrates an exemplary grinding process which may be performed using an ultrasonic grinding technique, wherein the surface to be ground is non-planar, including elevated components, e.g., discrete devices 15, which must be excluded from the grinding process.

A method and structure to improve thermal dissipation from semiconductor devices will be described herein below with reference to FIG. 2. The present invention relates to the cooling of integrated circuit (IC) packaging structures. More particularly the present invention is directed to the cooling of multiple chips, or ICs, using a common heat spreader or lid structure where the chips are ground subsequent to being permanently mounted to a wiring substrate or chip carrier to provide a backside of each chip with known geometric characteristics (e.g., all backsides of the chips being coplanar, convex or concave) in order to obtain desired cooling performance.

Figure 2:
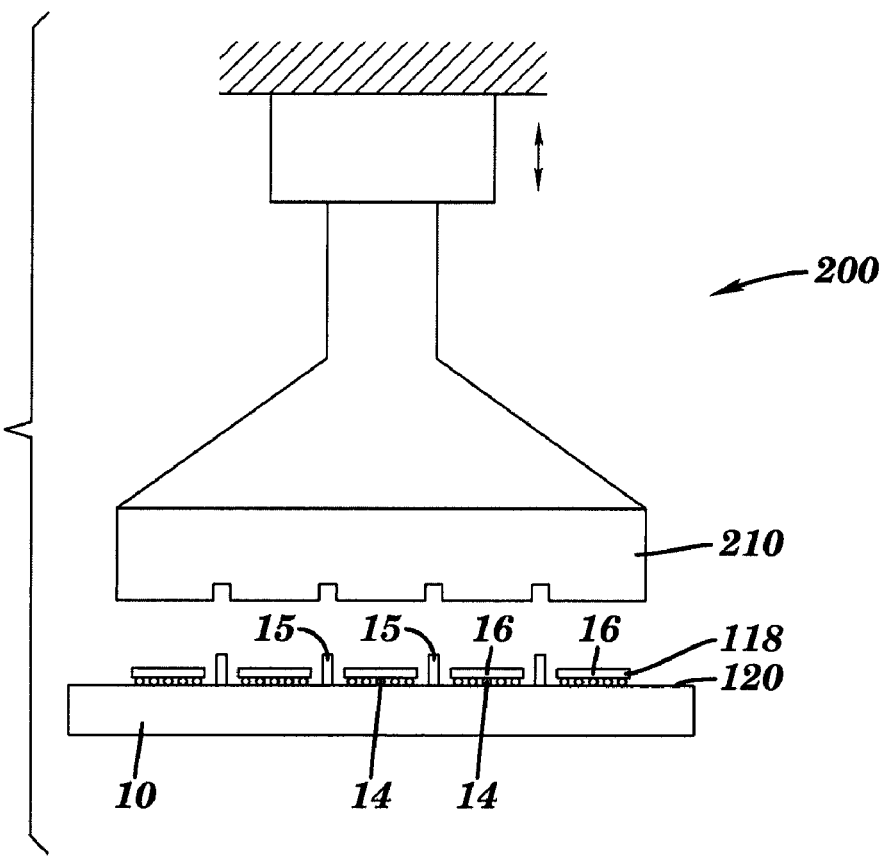
FIG. 2 is a cross-sectional schematic illustrating an exemplary embodiment of a process and structure of grinding a module assembly of chips mounted to a chip carrier using an ultrasonic grinding technique, wherein the surface to be ground is non-planar, including elevated components which must be excluded from the grinding process, in accordance with an embodiment of the invention.

Referring to FIG. 2, the method includes first mounting all "dummy" or discrete devices 15 and functional chip devices 16 on the substrate 10 via existing C-4 bonding processes. Alternatively, dummy devices 15 may be attached by a surface pad soldering process or by a non-solder adhesive process such as the polyimide tape process used for module spar attachment on high performance glass ceramic modules, as known in the pertinent art. Another potential standoff process could simply be the dispensing of a high temperature compatible organic (e.g., poyimide) dollop which would have a height greater than that of the functional devices 16.

Next, the underfill 13 (FIG. 1) suitable to the desired end purpose is dispensed around and underneath all functional chip devices 16. In exemplary embodiments, a reworkable underfill or edge sealant (e.g., polyvinyl butyral) is dispensed around and underneath all functional chip devices 16. This material protects all of the solder balls 14 (e.g., C-4's) from possible contamination during the subsequent grinding process of the backsides 118 of the chip devices 16 and provides mechanical support for the silicon chip device 16 during the grinding process. This way, the grinding forces are not completely borne by the C-4 solder, as the underfill material 13 provides lateral and normal support. It is anticipated that use of underfill material 13 will also minimize silicon damage potential. A non-reworkable underfill may also be used for this purpose assuming there is no requirement for device rework.

Next, the exemplary method of the present embodiment includes registering to either the backside 118 of the chip devices 16 or a top side 120 of the substrate 10 and grinding an appropriate amount from the backside 118 of the chip devices 16 such that at least the chip devices 16, on the module are coplanar and have been reduced to a desired thickness and height. Alternatively, the grinding process may grind an appropriate amount from the backsides 118 of the devices 15 and 16 such that all functional devices 15 and 16 and all non-functional devices on the substrate 10 of the module are coplanar and have been reduced to a desired height.

Referring to FIG. 9, this process may be carried out using tooling similar to that which is used for silicon wafer backside grinding, typically, a vertical spindle surface grinder. This tooling is comprised of an abrasive grinding wheel 115, typically known as a "cup wheel" extending from a rotating spindle 125. The composition (e.g. abrasive size, abrasive crystal species and bond hardness) of the wheel may be tailored to give the desired surface finish on the backside of the functional devices (e.g. silicon chips 16 and discreet devices 15) and the non-functional devices.

Referring to FIG. 10, the grinding process may also be carried out using a conventional machine shop horizontal spindle grinder. The grinding wheel 215 in this case is typically a common grinding wheel with abrasive boded to the periphery of the wheel. This wheel is attached to the rotating spindle 225. In either the horizontal or vertical spindle grinding processes, the substrate 10 can be positioned and moved to effect the grinding of the desired devices 15, 16. Alternatively, the grinding wheel and spindle assembly 210, 220 or 215, 225 can move to the desired grinding locations while the substrate 10 remains stationary.

Referring to FIGS. 2-6, still another tooling set which can perform the grinding process involves the use of ultrasonic milling heads 210 which oscillate normal or parallel to the surface of the devices 15, 16. These heads may be patterned to produce a plurality of surface contours on the backsides of the devices 15, 16.

In the case of coplanar device grinding, if desired, the backside surface of the devices may be polished utilizing a wheel equipped with an appropriate polishing pad and abrasive slurry. This equipment (not shown) is commonly found in the materials finishing and semiconductor industries. The soft nature of the pad along with the very fine polishing abrasive produces an "eased edge" on the backsides of the devices which improves their mechanical integrity. This process also has the beneficial effect of removing any loose or semi-loose silicon grinding residues from the device surface.

Depending on the chemistry of the underfill/edge seal material chosen, an appropriate rework process would be employed to remove the material from beneath and/or around all the devices. If non-reworkable underfills are used, they would remain intact.

Next, all decoupling capacitors are soldered as needed. Then, serialization of the device can be performed using either laser, ink or other marking techniques. If required, a non-reworkable underfill can be dispensed and cured around any devices 15, 16 as needed.

An appropriate hat/lid 20 (FIG. 1) is machined to mate to the substrate 10 assembly. For some high performance packages, the design of the hat or lid 20 resembles that which is used for "flat plate" cooling hats. In which case, the design includes additional features (not shown), which would mate with the ground standoff features extending from the substrate assembly. These hat features are held to a tight tolerance relative to the cooling surfaces in contact with or in close proximity to the devices 15, 16.

An appropriate amount of a thermal interface material 17 to serve as a heat transfer medium (e.g., thermal paste or grease) is dispensed on either the hat 20 or the silicon chip devices 16. Then the hat 20 can be assembled to the substrate 10 assuring that specially machined features (not shown) on the hat 20 are fully seated on the substrate assembly standoffs (e.g., discrete devices 15 as illustrated in FIG. 2) to assure a uniform or desired thermal gap 18 (see FIG. 1) above the chip 16.

Figure 3:
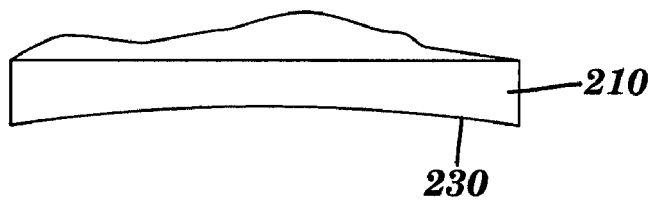
FIG. 3 is a cross-sectional schematic illustrating an ultrasonic milling head configured with a global concave surface profile which results in grinding a resulting global convex surface profile on the chip module, in accordance with an embodiment of the invention.
Figure 4:
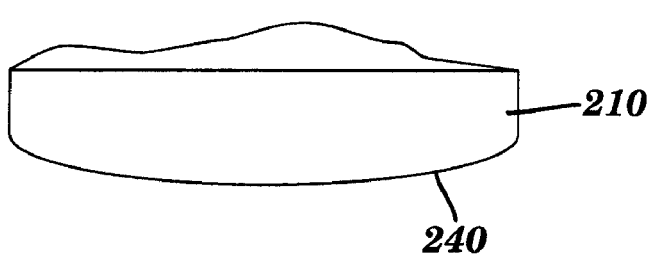
FIG. 4 is a cross-sectional schematic illustrating an ultrasonic milling head configured with a global convex surface profile which results in grinding a resulting global concave surface profile on the chip module, in accordance with an embodiment of the invention.
Figure 5:
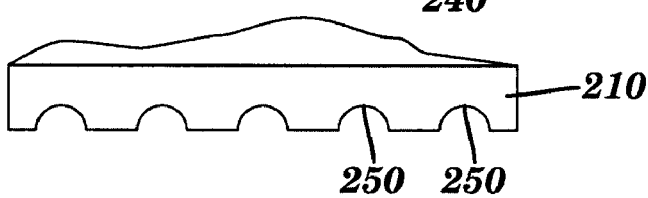
FIG. 5 is a cross-sectional schematic illustrating an ultrasonic milling head configured with a local concave surface profile which results in grinding a resulting local convex surface profile on the chip module corresponding at least to the chip devices, in accordance with an embodiment of the invention.
Figure 6:
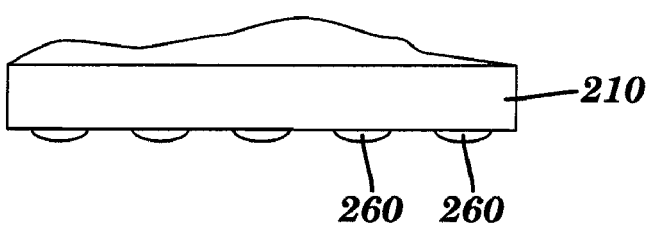
FIG. 6 is a cross-sectional schematic illustrating an ultrasonic milling head configured with a local convex surface profile which results in grinding a resulting local concave surface profile on the chip module corresponding at least to the chip devices, in accordance with an embodiment of the invention.

FIGS. 3-6 illustrate further exemplary embodiments of configuring the ultrasonic milling head 210 with the concept that the resulting ground surface profile of the backside of devices 15, 16 may be non-planar, either globally or locally. In particular, FIG. 3 illustrates an ultrasonic milling head 210 configured with a global concave surface profile 230 which results in grinding a resulting global convex surface profile on the chip module. FIG. 4 illustrates an ultrasonic milling head 210 configured with a global convex surface profile 240 which results in grinding a resulting global concave surface profile on the chip module. FIG. 5 illustrates an ultrasonic milling head 210 configured with a local concave surface profile 250 which results in grinding a resulting local convex surface profile on the chip module corresponding at least to the backside surface profiles of chip devices 16. FIG. 6 illustrates an ultrasonic milling head 210 configured with a local convex surface profile 260 which results in grinding a resulting local concave surface profile on the chip module corresponding at least to the backside surface profiles of chip devices 16.

FIGS. 7 and 8 illustrate further exemplary embodiments of configuring the ultrasonic milling head 210. In both cases with the concept that specific areas of the chip module may be ground more or less than other areas. FIG. 7 illustrates selective die thinning at portions of backsides of individual chips. FIG. 8 illustrates die thinning of entire backsides of individual chips 16 in which some chips are thinned more so than other chips 16. It will be obvious to those skilled in the art that the thermal interface gap can be individually customized for each device (i.e. not all the same) on a multichip module.

For example referring to FIG. 7, if the chip module includes "hot spots", it may be desirable to locally control the gap between an individual chip backside 118 and a hat (not shown) to be in thermal contact therewith to increase the heat transfer proximate those hot spots on an individual chip 16. FIG. 7 illustrates an ultrasonic milling head 210 having protrusions 310 extending from a major planar surface defining a bottom of the milling head 210. Each protrusion 310 corresponds to thinner local portions 318 of each backside 118 of individual chips 16. These thinner local portions 318 of each chip backside 118 correspond to local hot spots of the respective chip 16. In this manner, a hat with pedestals extending therefrom are in contact with the thinner local portions 318 of each chip backside 118.

FIG. 8 illustrates an ultrasonic milling head 210 having protrusions 310 extending from a major planar surface defining a bottom of the grinding head 210 in accordance with an alternative exemplary embodiment of the present invention. Each protrusion 310 corresponds to globally thinning an entire chip 416 relative to other chips 16 of the module. These thinner chips 418 correspond to higher power chips of the module. In this manner, a hat with pedestals extending therefrom are in contact with the thinner chips 418 of the module.

In order to accommodate a difference in coefficient of thermal expansion (ΔCTE) between the silicon device and the substrate carrier material (e.g., avoid thermal warpage of the silicon devices at field usage or operating temperatures), a grinding process can be carried out at an elevated or reduced temperature. It will be recognized by those skilled in the pertinent art that the module assembly having chips 16 permanently mounted to the substrate 10 can be heated or cooled during the grinding operation to optimize local or global chip curvature suited to the desired end purpose in the exemplary embodiments described above, based on a ΔCTE between the substrate 10 and chip 16 mounted thereto. For example, in the case of flexible organic substrates, the backside gap may be further controlled by controlling the temperature at which the grinding operation takes place. In other alternative exemplary embodiments, the module assembly may be held using a nonplanar vacuum chuck to bend the substrate 10 during the grinding process. For example, the vacuum in conjunction with the chuck controls the contour of the organic substrate during the grinding process. The device would warp when returned to room temperature (power off) but would be flat during actual usage (power on). Alternatively, the substrate 10 of the module assembly may be clamped in a planar condition.

FIGS. 9 and 10 illustrate the exemplary embodiment of grinding the backsides of the devices 15 and 16 utilizing conventional abrasive grinding tooling. FIG. 9 is a schematic drawing illustrating a grinding wheel 115 rotatable via a vertical spindle 125, while FIG. 10 is a schematic drawing illustrating a grinding wheel 215 rotatable via a horizontal spindle 225. In both instances of using the grinding wheels 115 of FIG. 9 and 215 of FIG. 10, the grinding wheels rotate about a respective spindle 125 of FIG. 9 and 225 of FIG. 10 in a direction indicated by a corresponding arrow and the module assembly remains stationary or can be move transversely to grind the desired regions of the device 15 and 16. In an alternative embodiment, the grinding wheel may or may not rotate and the module assembly is rotated. For example, FIG. 11 is a schematic drawing illustrating a support surface 300 for a chip module (not shown), the support surface which is rotatable about a vertical spindle 320 for grinding a backside of the chip module. The support surface 300 may be configured to rotate the chip module for global or individual chip site grinding.

Advantages of exemplary embodiments of the process and structure described above over the current practice include a more simplified hat/lid design. All that is needed with the hat/lid design is appropriate machined surfaces to mate with the ground standoff structures on the substrate. Another advantage includes a simpler assembly process in which no extra process steps are required to set soldered pistons and machine the backside of the hat/lid. Hats which are removed from modules requiring rework can be reused as there is no unique 'personality' which is created by use of the soldered pistons in the current high performance hats. Still another advantage includes improved thermal dissipation from the semiconductor devices of the module assembly. In addition to improving the uniformity of the paste gap on high end packages, the thermal path can be reduced by thinning down the Si as a result of the grinding process. Low and mid-range packages can benefit similarly from the reduced Si thickness and the planarity of the backside of the silicon as any crowned, bowed or otherwise warped devices would be rendered flat by the grinding process. It is desirable that the chip backsides have known geometric characteristics (e.g., backsides of all chips being coplanar) in order to obtain a desired cooling performance. The present disclosure controls the geometry of the chip backsides by grinding and/or polishing the chip backsides themselves after first level attachment. The chip backsides may be ground to be coplanar, or if desirable, may be ground to a non-planar configuration (e.g., convex or concave), either locally or globally.

Yet still another advantage includes the silicon backside surface roughness being tailored to minimize thermal paste movement and bleed out of the liquid phase vehicle component of the paste during module assembly and field usage. The ability to do this currently with the wafer backside grinding process is limited, as the silicon wafers have to survive the many process steps in semiconductor fabrication. A rougher surface makes the silicon wafers more prone to breakage during the many process steps involved in wafer fabrication.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of improving thermal dissipation from a module assembly, the method comprising:
   attaching a first side of at least one chip to a single chip carrier or multi chip carrier, the at least one chip having a second side opposite of the first side;
   grinding the second side of the at least one chip to a desired surface profile;
   selectively thinning a portion of the second side beyond the desired surface profile;
   applying a heat transfer medium on at least one of a heat sink, including a pedestal, and the second side of the at least one chip; and
   disposing the heat sink on the second side of the at least one chip with the pedestal positioned proximate to the selectively thinned portion and with the heat transfer medium therebetween defining a gap between the heat sink and the second side of the at least one chip,
   wherein the gap is controlled to improve heat transfer from the second side of the at least one chip to the heat sink.

2. The method of claim 1, wherein the chip carrier is one of a ceramic chip carrier or an organic chip carrier.

3. The method of claim 1, further comprising mounting a discrete device to the single chip carrier before the grinding.

4. The method of claim 3, wherein the discrete device is selected from the group consisting of semiconductors, inductors, capacitors, resistors and thermistors.

5. The method of claim 1, wherein the grinding includes grinding and polishing the second side of the at least one chip after being attached to the chip carrier to be one of in a coplanar or nonplanar configuration.

6. The method of claim 1, further comprising:
   mounting a first side of at least one dummy device on the chip carrier, each dummy device having a second side opposite of the first side; and
   grinding the second side of each dummy device to be one of coplanar with the second side of the at least one chip or surface ground as a standoff to register the at least one chip and dummy device to the heat sink.

7. The method of claim 1, further comprising dispensing an underfill at least one of around and under the at least one chip before the grinding.

8. The method of claim 1, wherein the heat transfer medium is one of a thermal paste or thermal grease.

9. The method of claim 1, wherein the grinding includes a dry grinding process carried out at an operating temperature above or below room temperature.

10. The method of claim 1, further comprising one of heating, cooling or clamping the chip carrier during the grinding to customize a shape of the chip carrier at an operation temperature thereof.

11. A module assembly comprising:
    a chip carrier substrate;
    a first side of at least one chip permanently mounted to the chip carrier, each chip having a second side opposite of the first side and including a locally thinned portion; and
    a heat sink, including a pedestal, disposed on the second side of each chip with the pedestal positioned proximate to the locally thinned portion to define a gap between the second side of the chip and the heat sink, the gap being filled with a heat transfer medium,
    wherein the gap is defined by grinding the second side of each chip to a desired surface profile after permanently mounting the at least one chip to the chip carrier substrate to control heat transfer from the second side of each chip to the heat sink.

12. The module assembly of claim 11, wherein the chip carrier substrate is one of a ceramic chip carrier substrate or an organic chip carrier substrate.

13. The module assembly of claim 11, further comprising at least one discrete device mounted to the chip carrier substrate.

14. The module assembly of claim 13, wherein the discrete device is selected from the group consisting of semiconductors, inductors, capacitors, resistors and thermistors.

15. The module assembly of claim 11, further comprising:
    a first side of at least one dummy device mounted on the chip carrier, each dummy device having a second side opposite of the first side; and
    the second side of each dummy device is ground to be one of coplanar with the second side of each chip or surface ground as a standoff to register each chip and dummy device to the heat sink.

16. The module assembly of claim 11, an underfill at least one of around and under the at least one chip.

17. The module assembly of claim 11, wherein the heat transfer medium is one of a thermal paste or thermal grease.

18. The module assembly of claim 11, wherein the gap is uniform.

19. A method of manufacturing an electronic packaging structure to enhance heat transfer performance, the method comprising:
    providing a chip carrier;
    providing at least one semiconductor device having a first side and a second side;
    permanently attaching the semiconductor device to the chip carrier with the first side facing the chip carrier;
    grinding the second side to a desired surface profile;
    selectively thinning a portion of the second side beyond the desired surface profile; and
    attaching a heat sink, including a pedestal, to the chip carrier with the pedestal positioned proximate to the selectively thinned portion of the second side of the semiconductor device and with a heat transfer paste disposed between the heat sink and the second side,
    wherein a gap between the second side and the heat sink is controlled via the grinding to improve heat transfer between the semiconductor device and the heat sink.

20. The method of claim 18, wherein the heat spreader is a package lid.

* * * * *